(12) United States Patent
Matsuura et al.

(10) Patent No.: US 10,153,794 B2
(45) Date of Patent: Dec. 11, 2018

(54) TRANSMITTER, COMMUNICATION UNIT AND METHOD FOR LIMITING SPECTRAL RE-GROWTH

(71) Applicant: MediaTek, Inc., Hsin-Chu (TW)

(72) Inventors: Toru Matsuura, Cupertino, CA (US); Paul Cheng Po Liang, Hsinchu County (TW)

(73) Assignee: MediaTek, Inc., Hsin-Chu (TW)

( * ) Notice: Subject to any disclaimer, the term of this patent is extended or adjusted under 35 U.S.C. 154(b) by 0 days.

(21) Appl. No.: 15/662,903

(22) Filed: Jul. 28, 2017

(65) Prior Publication Data

US 2018/0159568 A1 Jun. 7, 2018

Related U.S. Application Data

(60) Provisional application No. 62/429,156, filed on Dec. 2, 2016.

(51) Int. Cl.
| | |
|---|---|
| *H04B 1/04* | (2006.01) |
| *H04L 27/36* | (2006.01) |
| *H04L 25/03* | (2006.01) |
| *H03F 3/24* | (2006.01) |

(Continued)

(52) U.S. Cl.
CPC ......... *H04B 1/0475* (2013.01); *H03F 1/3247* (2013.01); *H03F 3/24* (2013.01); *H04B 1/006* (2013.01); *H04L 25/03343* (2013.01); *H04L 27/368* (2013.01); *H03F 2200/129* (2013.01);
(Continued)

(58) Field of Classification Search
CPC .......... H04B 1/0475; H04B 2001/0425; H04B 1/006; H04L 25/03343; H04L 27/368; H03F 1/3247; H03F 2200/411; H03F 2200/129; H03F 3/24
See application file for complete search history.

(56) References Cited

U.S. PATENT DOCUMENTS

| 5,923,712 A * | 7/1999 | Leyendecker | ........ H03F 1/3247 375/297 |
|---|---|---|---|
| 7,327,191 B2 * | 2/2008 | Shako | ................... H03F 1/3247 330/136 |

(Continued)

*Primary Examiner* — Jean B Corrielus
(74) *Attorney, Agent, or Firm* — Optimus Patents US, LLC

(57) ABSTRACT

A transmitter includes a signal generator arranged to generate a digital baseband signal representative of a signal for transmission; a digital predistortion, DPD, circuit configured to predistort the digital baseband signal; and a power amplifier is arranged to amplify the predistorted signal. The DPD circuit includes a first signal shaping circuit operably coupled to the signal generator and the DPD predistortion circuit and configured to receive the generated digital signal and apply first envelope shaping to shape the predistortion applied to at least the amplitude of the generated digital signal and produce a first DPD signal; a second signal shaping circuit operably coupled to the signal generator and an output of the DPD predistortion circuit and configured to receive and apply the second envelope shaped digital signal to the first DPD signal and produce a second envelope shaped DPD signal. A multiplier is configured to receive and multiply the digital signal and the second envelope shaped DPD signal and output a digitally predistorted signal for transmission.

20 Claims, 6 Drawing Sheets

(51) Int. Cl.
*H03F 1/32* (2006.01)
*H04B 1/00* (2006.01)

(52) U.S. Cl.
CPC ............... *H03F 2200/411* (2013.01); *H04B 2001/0425* (2013.01); *H04B 2001/0433* (2013.01)

(56) References Cited

U.S. PATENT DOCUMENTS

2002/0101938 A1* 8/2002 Horaguchi ............ H03F 1/3247
375/297
2005/0231279 A1* 10/2005 Moffatt ................. H03F 1/3247
330/149
2008/0174365 A1* 7/2008 Yang .................... H03F 1/3247
330/149

* cited by examiner

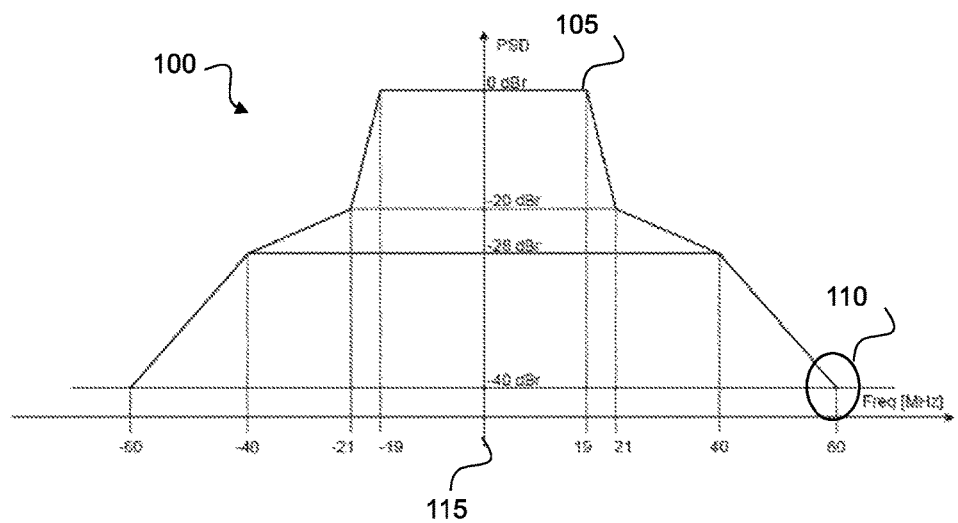
FIG. 1 - Prior Art
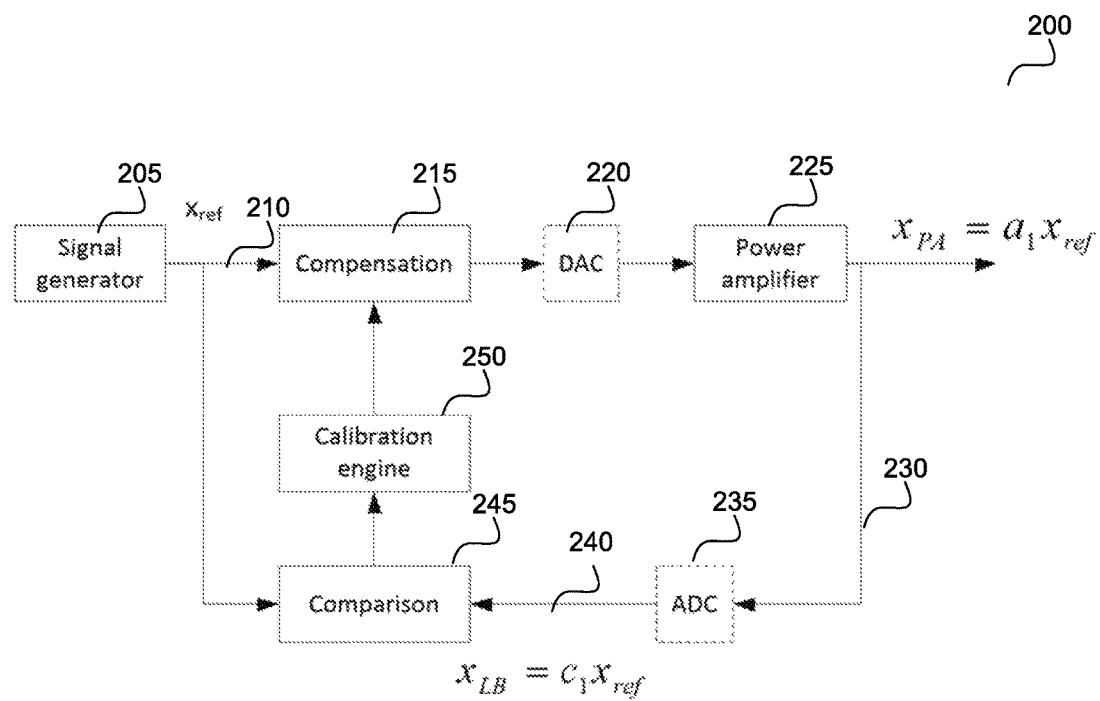
FIG. 2 - Prior Art

US 10,153,794 B2

TRANSMITTER, COMMUNICATION UNIT AND METHOD FOR LIMITING SPECTRAL RE-GROWTH

FIELD OF THE INVENTION

The field of this invention relates to a transmitter, a communication unit and method for controlling or limiting spectral re-growth, and in particular to controlling or limiting spectral re-growth within a transmitter in a wireless communication unit that employs digital predistortion.

BACKGROUND OF THE INVENTION

A primary focus and application of the present invention is the field of transmitters and radio frequency (RF) power amplifiers capable of use in wireless telecommunication applications. Continuing pressure on the limited spectrum available for radio communication systems is forcing the development of spectrally-efficient linear modulation schemes. Since the envelopes of a number of these linear modulation schemes fluctuate, these result in the average power delivered to the antenna being significantly lower than the maximum possible power, leading to poor efficiency of the power amplifier. Specifically, in this field, there has been a significant amount of research effort in developing high-power efficient topologies capable of providing useful performance in the 'back-off' (linear) region of the power amplifier.

Linear modulation schemes require linear amplification of the modulated signal in order to minimise undesired out-of-band emissions from spectral re-growth. However, the active devices used within a typical RF power amplifier are inherently non-linear by nature. Only when a small portion of the consumed direct current (DC) power is transformed into RF power, can the transfer function of the amplifying device be approximated by a straight line, i.e. as in an ideal linear amplifier. This mode of operation provides a low efficiency of DC to RF power conversion.

Additionally, the emphasis in portable (subscriber) equipment is to increase battery life. To achieve both linearity and efficiency, so called linearisation techniques are used to improve the linearity of the more efficient amplifier classes, for example class 'AB', 'B' or 'C' amplifiers. A number and variety of linearising techniques exist, such as Cartesian Feedback, Feed-forward, and Adaptive Digital Pre-distortion (DPD), which are often used when designing linear transmitters.

In order to increase the bit rate used in transmit uplink communication channels, larger constellation modulation schemes, with an amplitude modulation (AM) component are being investigated and, indeed, becoming required. These modulation schemes, such as sixteen-bit quadrature amplitude modulation (16-QAM), require linear PAs and are associated with high 'crest' factors (i.e. a degree of fluctuation) of the modulation envelope waveform. This is in contrast to the previously often-used constant envelope modulation schemes and can result in significant reduction in power efficiency and linearity.

To help overcome such efficiency and linearity issues, for various communications standards, a number of techniques have been proposed.

Referring to FIG. 1, a known output power spectrum mask 100 of WiFi™ enabled devices, showing the output power limits vs bandwidth from the carrier frequency 115 of a WiFi™ transmission, is illustrated. As illustrated, in WiFi™ enabled devices, the output power spectrum 100 requirement limits the output power 105. Linearization techniques, for example using pre-distortion, that may be employed to linearise the transmit signal, are unable to prevent spectral regrowth 110 at low output power levels distal from the carrier frequency 115. Thus, mechanisms to better control spectral regrowth are desired.

FIG. 2 illustrates a block diagram 200 of a known transmitter architecture that uses a digital pre-distortion (DPD) technique. Here, a signal generator 205 generates a DPD digital training signal ($X_{ref}$) 210 that is routed through the transmitter circuit, converted to analog form in a digital-to-analog converter (DAC) 220 and particularly routed through a power amplifier 225, such that the output signal ($X_{PA}$) 230 is an amplified analog representation of the DPD digital training signal ($X_{ref}$) 210. A portion of the output signal ($X_{PA}$) 230 is routed back to the DPD circuit and converted back to digital form 240 in analog-to-digital converter (ADC) 235, and subsequently compared to the DPD digital training signal ($X_{ref}$) 210 in a comparison circuit 245. A calibration circuit (engine) 250 determines how the transmitter circuitry, and particularly the power amplifier 225, has affected the DPD digital training signal ($X_{ref}$) 210 by analyzing the output from the comparison circuit 245 and determining PA nonlinearity (amplitude modulated to amplitude modulated (AM-to-AM) and amplitude modulated to phase modulated (AM-to-PM) effects. The calibration circuit (engine) 250 then adapts phase and gain components in the DPD compensation circuit 215 that, effectively, pre-distorts the input signal, e.g. DPD digital training signal ($X_{ref}$) 210, to compensate for the subsequent non-linearity and distortion effects that will be caused to the input signal by the transmitter circuit. In this manner, a linear transmitter signal is output from the power amplifier, with the inherent non-linearity effects that would have been created cancelled out by the DPD applied by the compensation circuit 215.

In order to meet output power spectrum requirement limits, such as those illustrated in FIG. 1, known transmitters selectively enable or disable DPD compensation circuits, for example based on measurement results of the output power spectrum, typically via an output power spectrum density (PSD) measurement of the PA fed back signal. Alternatively, in order to meet output power spectrum requirement limits, such as those illustrated in FIG. 1, known transmitters may just attenuate the whole output signal to reduce the output power across the whole bandwidth of operation in order to meet the spectrum mask.

U.S. Pat. No. 8,446,979 (2013, PMC-Sierra) describes a technique of envelope sharing whereby coefficients of a DPD are adapted to provide a soft-clip type of filter response characteristic versus a hard-clip type filter response characteristic to reduce the Peak-to-Average Power Ratio PAPR of the modulation signal. However, such a technique is best suited to the higher modulation coding scheme versions of communication standards. The book titled 'RF Power Amplifiers for Wireless Communications' and authored by Steve. C. Cripps, also describes a mechanism to compensate for predistortion as an input signal is sampled.

Thus, there exists a need for a more efficient and cost effective solution to reduce spectral re-growth control in RF transmitters, particularly for RF transmitters that employ linearization techniques such as DPD.

SUMMARY OF THE INVENTION

Accordingly, the invention seeks to mitigate, alleviate or eliminate one or more of the above mentioned disadvantages singly or in any combination.

According to a first aspect of the invention, there is provided a transmitter that includes a signal generator arranged to generate a digital baseband signal representative of a signal for transmission; a digital predistortion, DPD, circuit configured to predistort the digital baseband signal; and a power amplifier arranged to amplify the predistorted signal. The DPD circuit includes a first signal shaping circuit operably coupled to the signal generator and the DPD predistortion circuit and configured to receive the generated digital signal and apply first envelope shaping to shape the predistortion applied to at least the amplitude of the generated digital signal and produce a first DPD signal; a second signal shaping circuit operably coupled to the signal generator and an output of the DPD predistortion circuit and configured to receive and apply second envelope shaping to the generated digital signal and to apply the second envelope shaped digital signal to the first DPD signal and produce a second envelope shaped DPD signal; and a multiplier configured to receive and multiply the digital signal and the second envelope shaped DPD signal and output a digitally predistorted signal for transmission.

In this manner, a transmitter architecture is described, for example one that uses a DPD circuit, which is able to control spectral regrowth of a transmitted modulated signal based on shaping applied to the signal to be transmitted. In some examples, the shaping may be applied through control or adjustment of the DPD values applied to the signal to be transmitted within the DPD circuit.

In an optional example embodiment, DPD circuit may further include a DPD gain circuit configured to receive and adjust a gain of the first DPD signal and output a gain-adjusted first DPD signal to the second signal shaping circuit. In an optional example embodiment, the DPD circuit further comprises a Look-up table coupled to the DPD gain circuit and configured to provide a gain adjustment value to the DPD gain circuit to be applied by the DPD gain circuit to the first DPD signal.

In an optional example embodiment, a processor is coupled to the first signal shaping circuit and second signal shaping circuit and configured to determine arbitrary shaping control ($f_{TX}(x)$) to be applied, wherein the first and second signal shaping circuits are configured to apply shaping to the DPD circuit to predistort the amplitude of the generated signal. In an optional example embodiment, the wherein the arbitrary shaping control ($f_{TX}(x)$) is an order from a plurality of selectable orders of polynomial shaping determined by the processor, wherein the first signal shaping circuit and second signal shaping circuit are configured to apply polynomial shaping to the DPD circuit to predistort the amplitude of the generated signal. In this optional example embodiment, the polynomial shaping ($f_{TX}(x)$) applied by the second signal shaping circuit may be a function of abs(x) and corresponds to envelope control of the signal for transmission. In this optional example embodiment, the second signal shaping circuit is configured to apply only amplitude modulation, AM, control with shaping to the generated signal in addition to the first signal shaping circuit being configured to apply AM control and phase modulation, PM, control.

In an optional example embodiment, the shaping may employ non-polynomial shaping. In this example, the transmitter may further include at least one look-up table, LUT, coupled to the DPD circuit wherein the envelope shaping comprises DPD values that are stored by at least one of the first signal shaping circuit and second signal shaping circuit. The LUT stores DPD data that is adapted to account for PM effects due to the first signal shaping circuit applying amplitude modulation, AM, control of the generated signal with shaping.

In some examples, the first envelope shaping or second envelope shaping may be adapted using one of the following: (i) channel frequency (ii) standard (11a/b/n/ac/ax) (iii) modulation coding scheme (MCS), (iv) modulation bandwidth, or (v) output power.

In some examples, the envelope shaping may be determined and applied to the DPD circuit to predistort an envelope of the generated signal in a compensation process. In this example, the first shaping may include first polynomial shaping applied to the input digital signal in a DPD compensation path, applying the polynomial shaped input digital signal to a DPD gain circuit to predistort the polynomial shaped input digital signal and applying the predistorted polynomial shaped input digital signal to a second polynomial shaping circuit to shape predistortion applied to an amplitude of the generated input digital signal.

According to a second aspect of the invention, there is provided a communication unit having a transmitter that includes a signal generator arranged to generate a digital baseband signal representative of an envelope signal for transmission; a digital predistortion, DPD, circuit configured to predistort the digital baseband signal; a power amplifier arranged to amplify the predistorted signal; a first signal shaping circuit operably coupled to the signal generator and the DPD predistortion circuit and configured to receive the generated digital signal and apply first envelope shaping to shape the predistortion applied to at least the amplitude of the generated digital signal and produce a first DPD signal; a second signal shaping circuit operably coupled to the signal generator and an output of the DPD predistortion circuit and configured to receive and apply second envelope shaping to the generated digital signal and to apply the second envelope shaped digital signal to the first DPD signal and produce a second envelope shaped DPD signal; and a multiplier configured to receive and multiply the digital signal and the second envelope shaped DPD signal and output a digitally predistorted signal for transmission.

According to a third aspect of the invention, there is provided a method for limiting spectral re-growth within a transmitter. The method includes: generating a digital baseband signal representative of a signal for transmission; applying first envelope shaping to the digital baseband signal to form a first shaped digital predistorted, DPD, signal; identifying amplitude modulation compensation coefficients related to the first shaped DPD signal; applying second envelope shaping to the digital baseband signal using the identified amplitude modulation compensation coefficients to form a second shaped DPD signal; and multiplying the digital baseband signal with the second envelope shaped DPD signal and outputting a digitally predistorted signal for transmission. In this manner, the DPD shaping applied to at least an amplitude of a generated signal controls spectral re-growth.

These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the FIGs are illustrated for simplicity and clarity and have not necessarily been drawn to scale.

FIG. 1 illustrates a known output power spectrum showing the power limits vs frequency of a WiFi™ transmission.

FIG. 2 illustrates a block diagram of a known transmitter architecture that uses a digital pre-distortion (DPD) technique.

DETAILED DESCRIPTION

Figure 3:
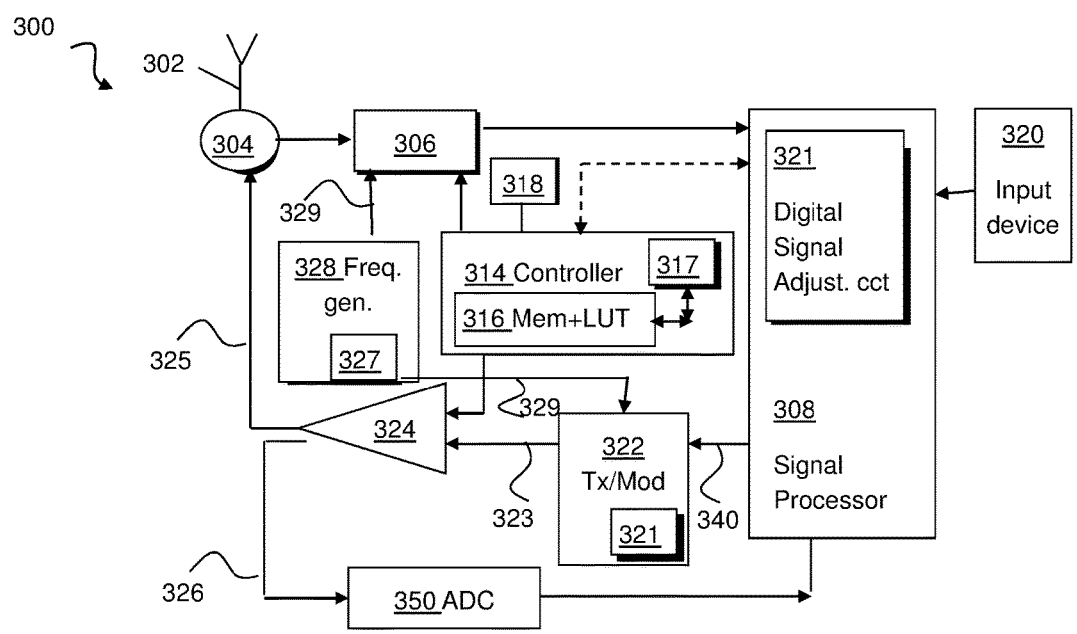
FIG. 3 illustrates a simplified block diagram of an example of a communication unit in accordance with some examples of the invention.

Examples of the invention will be described in terms of shaping of signals for use in a wireless communication unit, such as an user equipment (UE) in Long Term Evolved (LTE™) parlance that is WiFi™-enabled. Some examples of the invention describe techniques that can be used to provide polynomial shaping and other examples describe techniques that do not require polynomial shaping. Thus, any arbitrary shaping of the signal or envelope signal may be performed. It is envisaged that the shaping of signals of concepts herein described may be applicable in any situation where by control of spectral regrowth is desired. In the context of the examples of the invention, the term polynomial shaping of signals encompasses applying an inverse of the polynomial shaping of a signal. These examples of the invention will also be described in terms of a generic-order polynomial shaping of signals. However, in other examples it is envisaged that the arbitrary shaping function may be implemented by any other means, such as by accessing and using data from a LUT in order to benefit from the concepts herein described. In some examples, an arbitrary shaping control ($f_{TX}(x)$) may be an order of polynomial shaping from a plurality of selectable orders of polynomial shaping to predistort at least the amplitude of the generated signal.

Examples of the invention will also be described in terms of polynomial shaping of signals as applied to a linearization technique, such as digital pre-distortion, so that the shaping or polynomial shaping of signals can be applied as a part of the DPD operation. However, it is envisaged that the shaping or polynomial shaping of signals may be applied to other linearization techniques, or any system that employs a digital shaping of a signal to be transmitted. Examples of the invention will also be described in terms of shaping or polynomial shaping of a signal envelope in one or both of two paths: a calibration path (such as a DPD calibration path), a compensation path (such as a DPD compensation path).

The DPD calibration is performed for DPD training and in some examples it may be initiated either in a factory set-up, or following power-on of a terminal, or in response to a temperature change, whereby a training signal is used to determine the appropriate transmitter linearization values to use. In the DPD compensation phase, the transmitter output the modulation signal to a receiver and the modulation signal can be compensated by DPD shaping or polynomial shaping control.

Although examples of the invention are described with regard to using predistortion for radio frequency transmitters, it is envisaged that the concepts herein described are equally applicable to low frequency transmitters or millimeter wave transmitters.

Furthermore, because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

Referring now to FIG. 3, a block diagram of a wireless communication unit 300, adapted in accordance with some example embodiments of the invention, is shown. In practice, purely for the purposes of explaining embodiments of the invention, the wireless communication unit is described in terms of a wireless subscriber communication unit, which in some examples may be a smartphone supporting WiFi™ communications. The wireless communication unit 300 contains an antenna arrangement 302, for radiating signals and/or for receiving transmissions, coupled to an antenna switch 304 that provides isolation between receive and transmit chains within the wireless communication unit 300. One or more receiver chains, as known in the art, include(s) receiver front-end circuitry 306 (effectively providing reception, filtering and intermediate or base-band frequency conversion). The receiver front-end circuitry 306 is coupled to a signal processing module 308 (generally realized by a Digital Signal Processor (DSP)). A skilled artisan will appreciate that the level of integration of receiver circuits or components may be, in some instances, implementation-dependent.

A controller 314 maintains overall operational control of the wireless communication unit 300. The controller 314 is coupled to the receiver front-end circuitry 306 and the signal processing module 308. In some examples, the controller 314 is also coupled to a buffer module 317 and a memory device 316 that selectively stores data relating to operating functions, such as information relating to DPD gains, look-up-table information (say for a DPD), shaping algorithms and/or functions, inverse shaping algorithms and/or functions, and the like. In some examples, the shaping employed may encompass any shaping or any order of polynomial shaping. In the context of any order polynomial shaping, the shaping also encompasses any (or arbitrary) order of inverse polynomial shaping. In other examples, the shaping may be performed without polynomial shaping, and be implemented using data from, say, a look-up table (LUT). In this context, the shaping performed by an LUT may also encompass a second LUT to perform inverse shaping. A timer 318 is operably coupled to the controller 314 to control the timing of operations (e.g. transmission or reception of time-dependent signals) within the wireless communication unit 300.

The transmit chain includes transmitter/modulation circuitry 322 and a power amplifier 324 coupled to the antenna arrangement 302, which may comprise for example an antenna array, or plurality of antennas. The transmitter/modulation circuitry 322 and the power amplifier 324 are operationally responsive to the controller 314. In some examples, the signal processing module 308 and/or controller 314 may receive inputs from one or more input device or sensor modules 320. Frequency generation circuit 328 includes at least one local oscillator, LO, 327 and is operably coupled to the receiver front-end circuitry 306 and the transmitter/modulation circuitry 322 and arranged to provide local oscillator signals 329 thereto.

In example embodiments, the transmit chain includes a digital signal adjustment or shaping circuit 321, which may be located in transmitter/modulation circuitry 322 or within the signal processor 308, or any other suitable circuit, as shown. In some examples herein described, the digital signal adjustment or shaping circuit 321 may encompass DPD functionality with a DPD look-up-table (LUT), as described in later figures. In example embodiments, signal processor 308 generates a digital signal, such as a DPD digital training signal that is routed through the transmitter/modulation circuitry 322, converted to analog form in a DAC, typically located in transmitter/modulation circuitry 322 and routed through a power amplifier 324, such that the output signal 325 is an amplified analog representation of the DPD digital training signal. A portion 326 of the output signal 325 is converted back to digital form in down-converter and analog-to-digital converter (ADC) 350 and routed back to the digital signal adjustment or shaping circuit 321. The digital signal adjustment or shaping circuit 321 is configured to apply an arbitrary shaping or any order polynomial shaping to an input signal envelope in accordance with any one or more of the examples herein described with reference to FIGS. 4 to 7. In some examples, an arbitrary shaping control ($f_{TX}(x)$) may encompass selecting an order of polynomial shaping from a plurality of selectable orders of polynomial shaping to predistort at least the amplitude of the generated signal.

Clearly, a number of the various components within the wireless communication unit 300 can be realized in discrete or integrated component form, with an ultimate structure therefore being application-specific or design-based.

Figure 4:
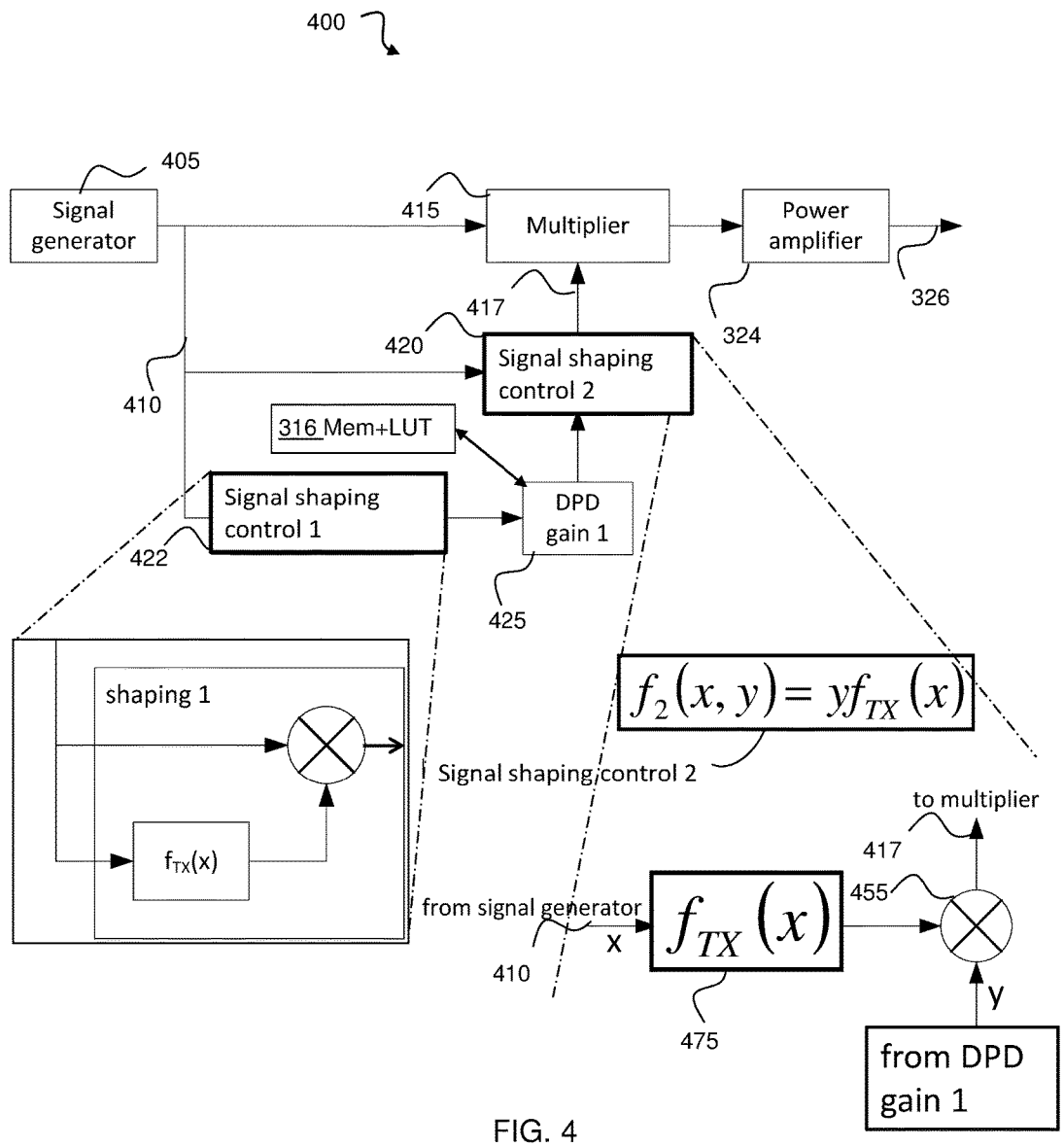
FIG. 4 illustrates a first example block diagram of an envelope shaping by DPD compensation arrangement in accordance with some examples of the invention.

Referring now to FIG. 4, a first example block diagram 400 of an envelope shaping by digital pre-distortion (DPD) compensation arrangement is illustrated, in accordance with some examples of the invention. In this example, a signal generator 405 generates a modulation signal 410, which is routed through the transmitter circuit, converted to analog form in an optional digital-to-analog converter (DAC) (not shown) and particularly routed through a power amplifier 324, such that the output signal ($X_{PA}$) 326 is an amplified analog representation of the modulation signal 410. The example illustrated in FIG. 4 applies to any (arbitrary) shaping function, which in this example is shown as a signal shaping control function. However, in other examples it is envisaged that the arbitrary shaping function may be implemented by any other means, such as by accessing and using data from a LUT.

In this example, modulation signal 410 is input to a first signal shaping control processing circuit 422 that performs first shaping operation on the modulation signal 410. A shaped representation of the modulation signal is output from the first shaping processing circuit 422 to a first DPD gain circuit 425, which is configured to calculate the AM (gain) compensation coefficients and/or PM compensation coefficients. In this example, the signal processing of the first signal shaping control is given in equation [1]:

$$f_1(x)=|x|f_{TX}(x) \quad [1]$$

In accordance with this first example of envelope shaping a signal by DPD compensation, the gain-adjusted shaped representation of the modulation signal and the modulation signal itself are input to a second signal shaping processing circuit 420 that performs a second shaping operation. The second signal shaping processing circuit 420 performs a second desired shaping control operation on the gain-adjusted shaped representation of the modulation signal and outputs a second gain-adjusted shaped representation of the modulation signal 417, in accordance with $f_{TX}(x)$s of equations [1] and [2], to a multiplier 415. The multiplier 415 is configured to multiply the modulation signal with the second gain-adjusted shaped representation of the modulation signal 417 to produce a signal to the power amplifier 324 that results in a lower spectral regrowth power amplifier output 326. In this manner, an envelope shaped transmitter signal is output from the power amplifier 324, with the inherent non-linearity effects that would have been created cancelled out.

In this example, the second signal shaping control processing circuit 420 is configured to apply shaping or a generic order polynomial shaping in a DPD compensation process, which is particularly useful for controlling the spectral regrowth of the transmit signal to meet a WiFi™ spectral mask. In this example, the second signal shaping processing circuit 420 includes a processor 475 configured to apply the shaping function, for example $f_2$ in equation [2], to the modulation signal 410, which is then multiplied to the signal from the gain calculation circuit 425, which is configured to calculate the AM (gain) compensation coefficients, in multiplier 455.

$$f_2(x,y)=yf_{TX}(x) \quad [2]$$

In some examples, shaping or a generic order polynomial shaping is applied in a DPD compensation arrangement. In some examples, the gain calculation circuit 425 may be a DPD look up table (LUT) input. In some examples, the LUT may apply both the gain to the output from first signal shaping processing circuit 422 as well as shaping to the output from first signal shaping processing circuit 422 and the signal generator output 410.

In some alternative examples, the DPD compensation may be a polynomial DPD instead of a gain-adjusted signal or a LUT DPD. Here, discrete AM-AM and AM-PM compensation data is stored in the DPD LUT and compensation coefficients are calculated by interpolation by the discrete DPD LUT. In the meantime, polynomial coefficients are stored in the memory in the case of polynomial DPD and compensation coefficients are calculated by a polynomial calculation. Two shaping blocks are required mathematically due to PA nonlinearity.

In some examples, it is envisaged that a non-polynomial implementation may avoid unnecessary distortion at low output power and saturation region of PA may apply one of the following shaping functions:

$$f_{TX}(x) = 1 \text{ if } x < x_0; \quad [3]$$

$$f_{TX}(x) = 1 - a_3|x|^2 \text{ if } x_0 \le x < x_1; \quad [4]$$

$$f_{TX}(x) = \frac{x_1}{|x|} \text{ if } x \ge x_1 \quad [5]$$

Additionally, in some examples, $f_{TX}(x)$ can be arbitrary and the shaping function stored in LUT.

In some examples, it is envisaged that the performed shaping operation may be adapted using one of the following: (i) channel frequency (ii) standard (11a/b/n/ac/ax) (iii) modulation coding scheme (MCS), (iv) modulation bandwidth, or (v) output power.

The desired shape, $f_{TX}(x)$ may be different between respective channel frequencies. For example, generally, the spectrum requirement may be tougher at a band-edge in order to avoid interference to other neighboring systems. Then, it is possible to improve the spectrum regrowth more at such channel frequencies by applying another shape than the one used on the in-band channel.

Similarly, transmitter requirement and analog behavior are different among standards (IEEE 802.11a/b/n/ac/ax), modulation coding scheme (MCS), modulation bandwidth, and output power. So, the multiple LUTs are prepared to support various shapes and they are controlled by the transmitter parameters, like channel frequency, standard, MCS, modulation bandwidth, output power.

Figure 5:
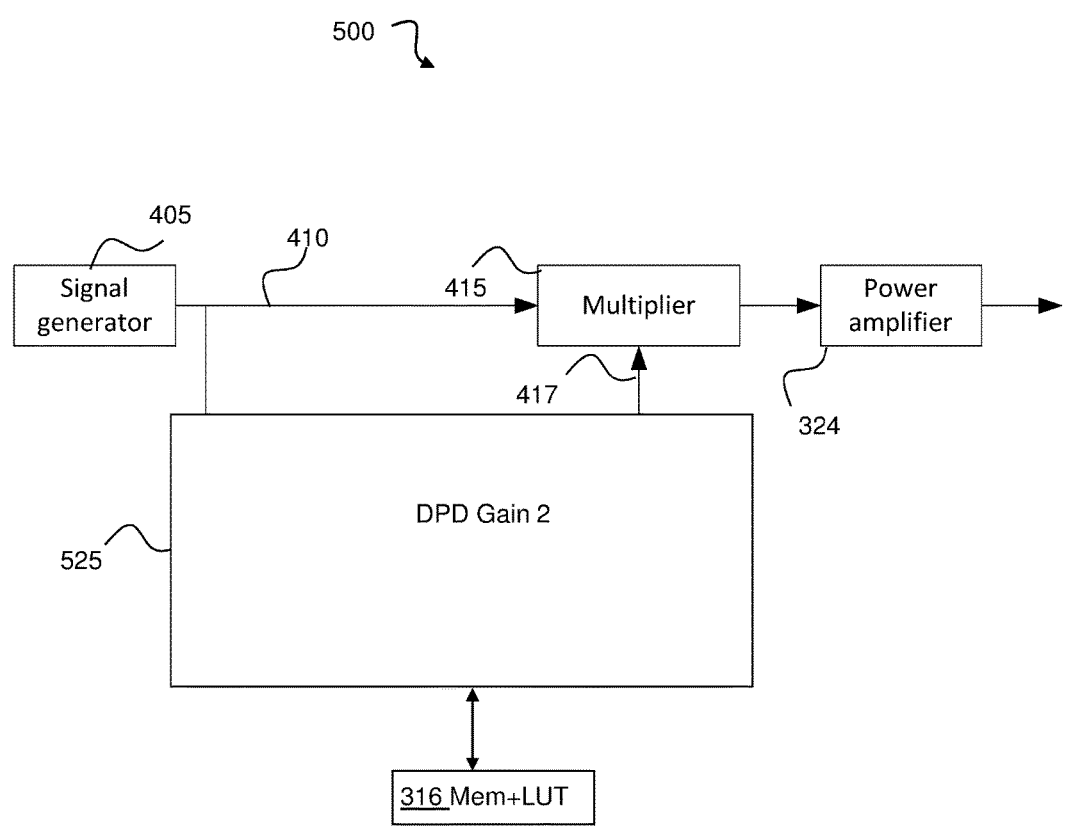
FIG. 5 illustrates a second example block diagram of an envelope shaping by DPD compensation arrangement in accordance with some examples of the invention.

Referring now to FIG. 5, a second example block diagram 500 of an envelope shaping by digital pre-distortion (DPD) compensation arrangement is illustrated, in accordance with some examples of the invention. This second example block diagram 500 of an envelope shaping by digital pre-distortion (DPD) compensation arrangement employs a similar strategy to the first compensation arrangement in FIG. 4, with the first signal shaping processing circuit (e.g. 422 of FIG. 4), first gain calculation circuit 425 and second signal shaping processing circuit 420 replaced by a second DPD gain circuit 525. The example illustrated in FIG. 5 applies to an arbitrary shaping or generic order polynomial shaping function. However, in other examples it is envisaged that the arbitrary shaping function may be implemented by any other means, such as by accessing and using data from a LUT. In this manner, the transfer function of the two shaping operations, 420 and 422, and the first gain calculation circuit 425 in FIG. 4 may be pre-calculated and stored as a second DPD gain in DPD LUT. In this example, there is no real-time implementation of shaping, as this has been pre-calculated and may be implemented with appropriate second DPD gain values from a DPD LUT. Consequently, a reduction in hardware (or firmware) may be achieved in the circuit of FIG. 5 compared to the circuit of FIG. 4.

Figure 6:
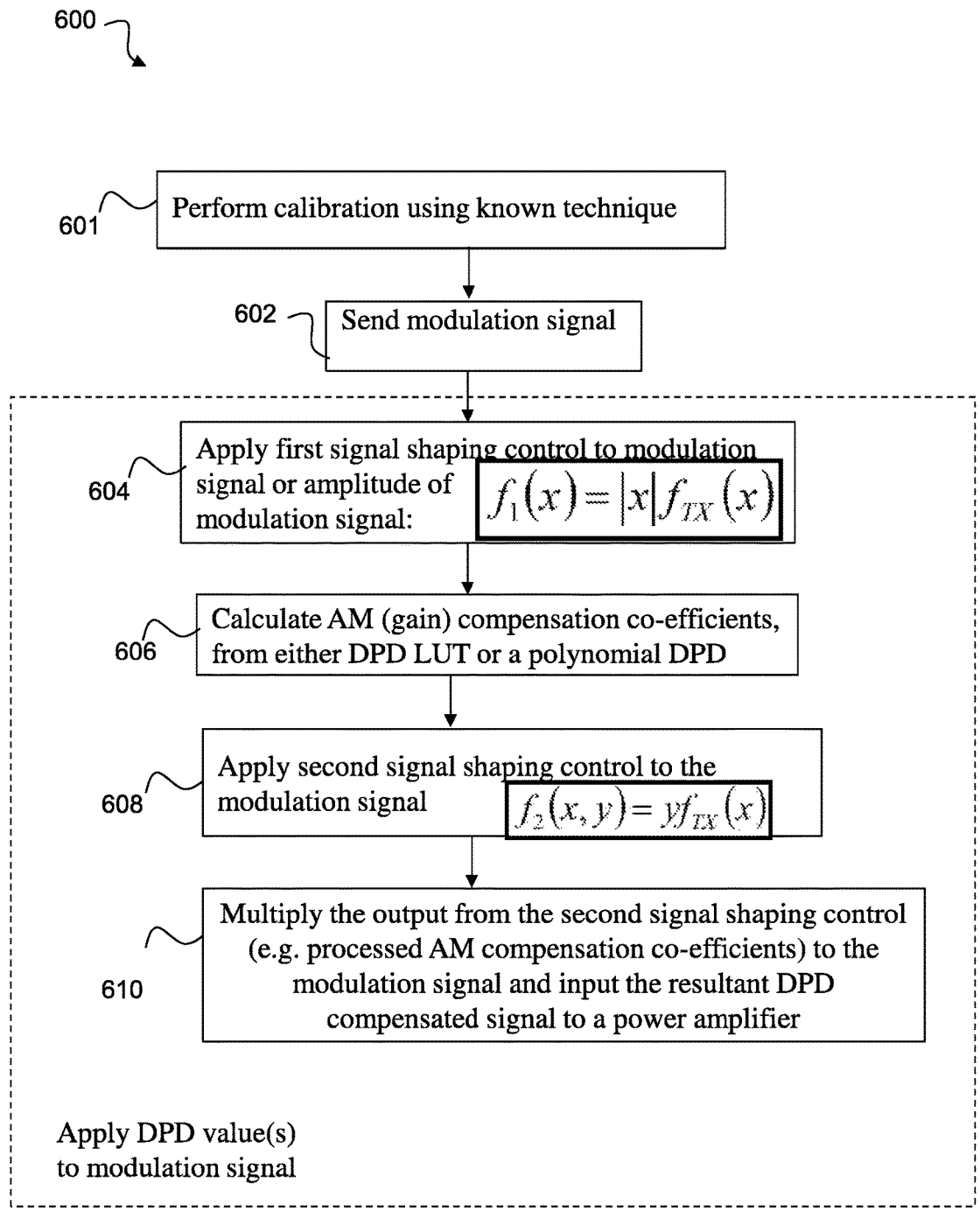
FIG. 6 illustrates a first example flowchart of an envelope shaping by DPD compensation in accordance with some examples of the invention.
Figure 7:
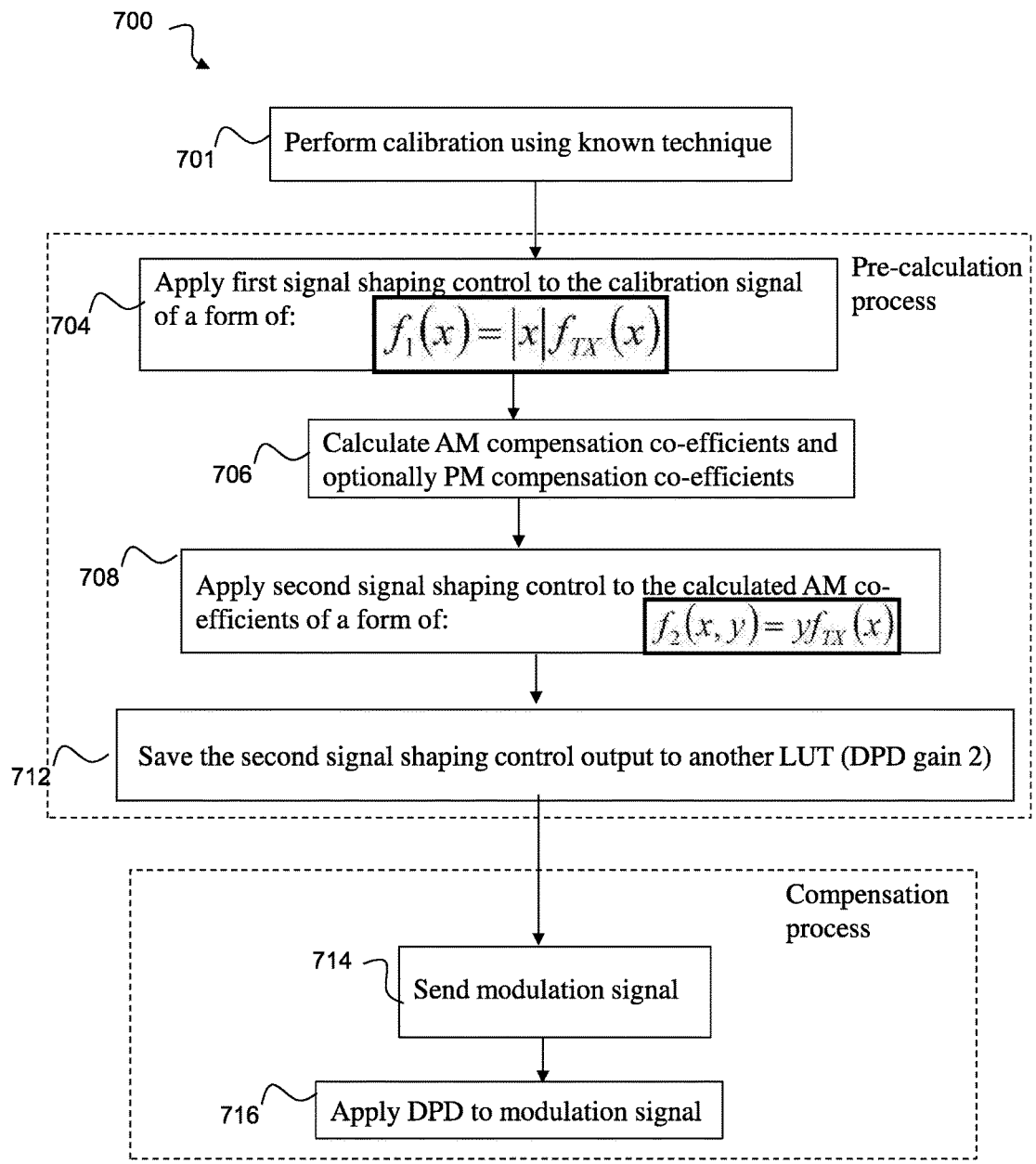
FIG. 7 illustrates a second example flowchart of an envelope shaping by DPD compensation, in accordance with some examples of the invention.

Referring now to FIG. 6, a first example flowchart 600 of an envelope shaping by digital pre-distortion (DPD) compensation is illustrated, in accordance with some examples of the invention. In this example, at 601, a calibration process is performed, which may use known DPD calibration techniques. A calibration process may include sending a calibration signal to the transmitter, applying a DPD adjustment to the calibration signal and comparing a feedback signal from a transmitter power amplifier with a reference signal, e.g. the input calibration signal, and updating the DPD values, say in a DPD LUT, accordingly. This calibration process may be performed one or multiple times, for example to fine-tune the DPD values.

A compensation process may then be implemented, with a modulation signal generated that is is the same as a conventional output signal of 'x' and sent at 602, which is routed through the transmitter circuit, converted to analog form in an optional digital-to-analog converter (DAC) and particularly routed through a power amplifier. At 604, a first signal shaping control is applied to the modulation signal or amplitude modulation part of the modulation signal, according to the equation [1]:

At 606, the AM (gain) compensation coefficients are calculated from either DPD LUT or a polynomial DPD. At 608, the second signal shaping control is applied to the modulation signal. At 610, the output from the second signal shaping control (e.g. processed AM compensation coefficients) is multiplied with the modulation signal and then the resultant DPD compensated signal is input to a power amplifier. In this manner, the flowchart operates in a similar manner to the circuit in FIG. 4.

Alternatively, in a similar manner to the circuit in FIG. 5, a pre-calculated DPD gain compensation may be applied to the modulation signal. This is illustrated in the example flowchart 700 of FIG. 7. In this example, at 701, a calibration process is performed, which may use known techniques. A calibration process may include sending a calibration signal to the transmitter, applying a DPD adjustment to the calibration signal and comparing a feedback signal from a transmitter power amplifier with a reference signal, e.g. the input calibration signal, and updating the DPD values, say in a DPD LUT, accordingly. This calibration process may be performed one or multiple times, for example to fine-tune the DPD values.

In this example, a pre-calculation process is then performed with the pre-calculated DPD gain compensation being equivalent to a combination of the two shaping operations, 422, 420 and the calculation of the AM (gain) compensation coefficients circuit 425 in FIG. 4. In this example, a first signal shaping control, according to the function in equation [1] is applied to the calibration signal at 704. In some examples, the calibration signal at 704 may be a discrete level that corresponds to the DPD LUT value. At 706, AM compensation coefficients, and optionally PM compensation coefficients, are calculated. At 708, a second signal shaping control, according to the function in equation [2] is applied to the calculated AM coefficients. At 712, the second signal shaping control output is saved to another LUT (e.g. as DPD gain-2).

A compensation process may then be implemented, with a modulation signal generated at 714 and the pre-calculated DPD value(s) applied at 716 before being routed through the transmitter circuit, converted to analog form in an optional digital-to-analog converter (DAC) and particularly routed through a power amplifier. The example illustrated in 714 of FIG. 7 applies to an arbitrary shaping function. However, in other examples it is envisaged that the polynomial shaping control function may be implemented as an example by any other means, such as by accessing and using data from a LUT.

In some example embodiments, the examples herein described may increase transmitter output power for low order modulation signals, due to the lower spectral regrowth, so long as the output power meets the spectrum mask specification.

In some examples, for example in a WiFi™ system, the examples herein described may enhance communication coverage, for example where the communication standard does not specify the maximum output power. Such communication standards may employ low modulation coding schemes (MCS), such that examples herein described may improve the spectral mask.

In some examples, a conventional DPD calibration plus shaped compensation technique may not require an additional DPD LUT for shaping, which provides an implementation benefit compared with an insertion of shaping block in calibration step.

In a 'DPD compensation' sense, where a conventional calibration is executed and the known compensation approach of FIG. 2 is used to support high order modulation (256QAM), a DPD LUT may be configured to provide good EVM. In contrast, in accordance with some examples, the novel shaping or generic order polynomial envelope shaping DPD compensation techniques of FIGS. 4-6 may better support a low order modulation (such as BPSK), Furthermore, the DPD LUT plus envelope shaping provides a low spectrum regrowth. Advantageously, no additional DPD calibration time is required and no additional LUT (e.g. saving die space) is needed in this embodiment.

In the foregoing specification, the invention has been described with reference to specific examples of embodiments of the invention. It will, however, be evident that various modifications and changes may be made therein without departing from the scope of the invention as set forth in the appended claims.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

However, other modifications, variations and alternatives are also possible. The specifications and drawings are, accordingly, to be regarded in an illustrative rather than in a restrictive sense.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected', or 'operably coupled', to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

For example, in some example embodiments, it is envisaged that a single processor may be configured to perform multiple functions and operations of circuits hereinbefore described. Furthermore, in some example embodiments, although the LUTs (e.g. storing first and second DPD gains) have been described individually, thereby suggesting that they may comprise separate memory elements, it is envisaged that a number or each may form a portion of a single LUT or memory element.

Also for example, the various components/modules, or portions thereof, may implemented as soft or code representations of physical circuitry or of logical representations convertible into physical circuitry, such as in a hardware description language of any appropriate type. However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an', as used herein, are defined as one, or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The connections as discussed herein may be any type of connections suitable to transfer signals from or to the respective nodes, units or devices, for example via intermediary components. Accordingly, unless implied or stated otherwise, the connections may for example be direct connections or indirect connections. The connections may be illustrated or described in reference to being a single connection, a plurality of connections, unidirectional connections or bidirectional connections. However, different illustrated examples may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

It will be appreciated that, for clarity purposes, the above description has described embodiments of the invention with reference to different functional units and processors. However, it will be apparent that any suitable distribution of functionality between different functional units or processors, for example one or more shaping circuits, etc., may be used without detracting from the invention. Hence, references to specific functional units are only to be seen as references to suitable means for providing the described functionality, rather than indicative of a strict logical or physical structure or organization.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individually listed, a plurality of means, elements or method steps may be implemented by, for example, a single unit or processor. Additionally, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to 'a', 'an', 'first', 'second', etc. do not preclude a plurality.

Thus, lower spectral regrowth solutions have been described, wherein the aforementioned disadvantages with prior art arrangements have been substantially alleviated.

We claim:

1. A transmitter comprising:
   a signal generator arranged to generate a digital baseband signal representative of a signal for transmission;
   a digital predistortion (DPD) circuit configured to apply predistortion to the digital baseband signal for providing a digitally predistorted signal; and
   a power amplifier arranged to amplify the digitally predistorted signal;
   wherein the DPD circuit comprises:
   a first signal shaping circuit operably coupled to the signal generator and configured to receive the generated digital signal and apply first envelope shaping to shape the predistortion applied to at least an amplitude of the generated digital signal and produce a first DPD signal;
   a second signal shaping circuit operably coupled to the signal generator and an output of the first signal shaping circuit and configured to receive and apply second envelope shaping to the generated digital signal and to apply the second envelope shaped digital signal to the first DPD signal and produce a second envelope shaped DPD signal; and
   a multiplier configured to receive and multiply the digital signal and the second envelope shaped DPD signal and output the digitally predistorted signal for transmission.

2. The transmitter of claim 1 wherein the DPD circuit further comprises a DPD gain circuit configured to receive and adjust a gain of the first DPD signal and output a gain-adjusted first DPD signal to the second signal shaping circuit.

3. The transmitter of claim 2 wherein the DPD circuit further comprises a Look-up table coupled to the DPD gain circuit and configured to provide a gain adjustment value to the DPD gain circuit to be applied by the DPD gain circuit to the first DPD signal.

4. The transmitter of claim 1 further comprising a processor coupled to the first signal shaping circuit and second signal shaping circuit and configured to determine arbitrary shaping control signal, $f_{TX}(x)$, to be applied, wherein the first and second signal shaping circuits are configured to apply shaping to the DPD circuit to predistort the amplitude of the generated signal.

5. The transmitter of claim 4 wherein the first signal shaping circuit has a form of $$f_1(x)=|x|f_{TX}(x)$$

where: $f_1(x)$ is a first signal shaping function applied to a modulation signal (x)[, and $f_{TX}(x)$ is an arbitrary shaping control signal].

6. The transmitter of claim 4 wherein the second signal shaping circuit has a form of $$f_2(x,y)=y\,f_{TX}(x)$$

where: $f_2(x, y)$ is a second signal shaping function applied to a modulation signal (x), [$f_{TX}(x)$ is an arbitrary shaping control signal,] and
y represents at least one calculated gain compensation coefficient.

7. The transmitter of claim 4 wherein the arbitrary shaping control signal ($f_{TX}(x)$) is an order from a plurality of selectable orders of polynomial shaping determined by the processor, wherein the first signal shaping circuit and second signal shaping circuit are configured to apply polynomial shaping to the DPD circuit to predistort the amplitude of the generated signal.

8. The transmitter of claim 7 wherein the polynomial shaping applied by the second signal shaping circuit is a function of an absolute value of a modulation signal, abs(x).

9. The transmitter of claim 4 wherein the second signal shaping circuit is configured to apply only amplitude modulation (AM) control with shaping to the generated signal in addition to the first signal shaping circuit being configured to apply AM control and phase modulation (PM) control.

10. The transmitter of claim 1 wherein at least one of the first signal shaping circuit and the second signal shaping circuit employs non-polynomial shaping according to one of the following shaping functions:

$$f_{TX}(x) = 1 \text{ if } x < x_0;$$

$$f_{TX}(x) = 1 - a_3|x|^2 \text{ if } x_0 \le x < x_1;$$

$$f_{TX}(x) = \frac{x_1}{|x|} \text{ if } x \ge x_1$$

where $f_{TX}$ is the shape function, x is a modulation signal, $a_n$ is an arbitrary coefficient of an nth order term in the non-polynomial shaping.

11. The transmitter of claim 1 further comprising at least one look-up table (LUT) coupled to the DPD circuit wherein at least one of the first signal shaping circuit and the second signal shaping circuit comprises DPD values that are stored by the at least one of the first signal shaping circuit and second signal shaping circuit.

12. The transmitter of claim 11 wherein the LUT stores DPD data that is adapted to account for phase modulation (PM) effects due to the first signal shaping circuit applying amplitude modulation (AM) control of the generated signal with shaping.

13. The transmitter of claim 1 wherein the first envelope shaping or second envelope shaping is adapted using one of the following: (i) channel frequency of the transmitter, (ii) IEEE standard 802.11a/b/n/ac/ax, (iii) modulation coding scheme (MCS) supported by the transmitter, (iv) modulation bandwidth of the transmitter, or (v) output power of the transmitter.

14. The transmitter of claim 1 wherein envelope shaping is determined and applied to the DPD circuit to predistort an envelope of the generated signal in a compensation process.

15. A communication unit comprises a transmitter comprising:
   a signal generator arranged to generate a digital baseband signal representative of a signal for transmission;
   a digital predistortion (DPD) circuit configured to apply predistortion to the digital baseband signal for providing a digitally predistorted signal; and
   a power amplifier arranged to amplify the digitally predistorted signal;
   wherein the DPD circuit comprises:
   a first signal shaping circuit operably coupled to the signal generator and configured to receive the generated digital signal and apply first envelope shaping to shape the predistortion applied to at least an amplitude of the generated digital signal and produce a first DPD signal;
   a second signal shaping circuit operably coupled to the signal generator and an output of the first signal shaping circuit and configured to receive and apply second envelope shaping to the generated digital signal and to apply the second envelope shaped digital signal to the first DPD signal and produce a second envelope shaped DPD signal; and a multiplier configured to receive and multiply the digital signal and the second envelope shaped DPD signal and output the digitally predistorted signal for transmission.

16. A method for limiting spectral re-growth within a transmitter, the method comprising:

generating a digital baseband signal representative of a signal for transmission;

applying first envelope shaping to the digital baseband signal to form a first shaped digitally predistorted (DPD) signal;

identifying amplitude modulation compensation coefficients related to the first shaped DPD signal;

applying second envelope shaping to the digital baseband signal using the identified amplitude modulation compensation coefficients to form a second shaped DPD signal; and multiplying the digital baseband signal with the second envelope shaped DPD signal and outputting a digitally predistorted signal for transmission.

17. The method of claim 16 further comprising, in a calibration process, calculating and storing in a look-up table (LUT) amplitude modulation compensation coefficients of the first shaped DPD signal, such that identifying amplitude modulation compensation coefficients related to the first shaped DPD signal comprises extracting the stored LUT amplitude modulation compensation coefficients and adjusting a gain of the first DPD signal.

18. The method of claim 16 further comprising, in a calibration process, calculating and amplitude modulation compensation coefficients of the first shaped DPD signal to effect polynomial shaping in the second shaped DPD signal.

19. The method of claim 16 further comprising determining and applying arbitrary shaping control ($f_{TX}(x)$) to predistort at least an amplitude of the generated signal.

20. The method of claim 19 wherein the arbitrary shaping control ($f_{TX}(x)$) is an order from one or a plurality of selectable orders of polynomial shaping to predistort at least the amplitude of the generated signal.

* * * * *